(12) United States Patent
Hwang

(10) Patent No.: US 6,492,198 B2
(45) Date of Patent: Dec. 10, 2002

(54) METHOD FOR FABRICATING A SEMICONDUCTOR DEVICE

(75) Inventor: Chan Seung Hwang, Koonpo (KR)

(73) Assignee: Samsung Electronics, Co., Ltd., Kyungki-do (KR)

( * ) Notice: Subject to any disclaimer, the term of this patent is extended or adjusted under 35 U.S.C. 154(b) by 0 days.

(21) Appl. No.: 09/965,139

(22) Filed: Sep. 26, 2001

(65) Prior Publication Data

US 2002/0020855 A1 Feb. 21, 2002

Related U.S. Application Data

(62) Division of application No. 09/644,182, filed on Aug. 22, 2000.

(51) Int. Cl.⁷ .............................................. H01L 21/44
(52) U.S. Cl. ...................................... 438/108; 257/778
(58) Field of Search ................................ 438/106, 119, 438/613, 108; 257/738, 778

(56) References Cited

U.S. PATENT DOCUMENTS

| | | | |
|---|---|---|---|
| 4,060,828 A | 11/1977 | Satonaka | 257/744 |
| 4,268,849 A | 5/1981 | Gray et al. | 257/745 |
| 4,742,014 A | 5/1988 | Hooper et al. | 438/643 |
| 5,391,517 A | 2/1995 | Gelatos et al. | 437/190 |
| 5,622,895 A | 4/1997 | Frank et al. | 216/18 |
| 6,030,512 A * | 2/2000 | Ihara et al. | 204/224 R |
| 6,093,476 A | 7/2000 | Horiuchi et al. | 428/209 |
| 6,181,569 B1 * | 1/2001 | Chakravorty | 361/761 |
| 6,132,851 A1 | 2/2001 | Poutasse | 428/209 |
| 6,187,615 B1 | 2/2001 | Kim et al. | 438/113 |
| 6,197,613 B1 | 3/2001 | Kung et al. | 438/106 |
| 6,218,281 B1 | 4/2001 | Watanabe, et al. | 438/612 |
| 6,287,893 B1 * | 9/2001 | Elenius et al. | 438/108 |

FOREIGN PATENT DOCUMENTS

| | | | |
|---|---|---|---|
| JP | 0615618 A | 5/1994 | 257/710 |
| JP | 6-151618 | 5/1994 | H01L/23/02 |
| JP | 11-234082 | 8/1999 | H03H/9/145 |

OTHER PUBLICATIONS

*Surface modification of copper for adhesion promotion by polybenzimidazole* J. Adhesion Sci. Technol. vol. 8 No. 9, pp. 971–979 (1994).

\* cited by examiner

Primary Examiner—David Nelms
Assistant Examiner—Quoc Hoang

(57) ABSTRACT

A semiconductor device includes a semiconductor chip, a first polymer layer on passivation of the semiconductor chip, patterned first under barrier metal (UBM) layers on the first polymer layer and chip pads exposed by the first polymer layer and the passivation, a copper redistribution pattern on the first UBM layers, said copper redistribution pattern electrically connected to the chip pads, a barrier metal on the copper redistribution pattern, a second polymer layer on the first polymer layer and the copper redistribution pattern, and external connecting electrodes on portions of the copper redistribution pattern exposed by the second polymer layer. The barrier metal is chrome (Cr), nickel (Ni), or nickel-chrome (Ni—Cr) in one or more layers. The barrier metal may further include a metal inner complex formed by reacting the surface the Cr or Ni layer with a silane or an azole group solution. The semiconductor device further includes second under barrier metal (UBM) layers under each of the external connecting electrodes. Further, a method for fabricating the above-described semiconductor device plates the copper redistribution pattern and the barrier metal onto the device using the same mask for both plating processes.

13 Claims, 9 Drawing Sheets

METHOD FOR FABRICATING A SEMICONDUCTOR DEVICE

CROSS REFERENCE TO RELATED APPLICATION

This application is a division of and claims priority from U. S. patent application Ser. No. 09/644,182, filed Aug. 22, 2000, entitled, "Redistributed Chip Size Package And Method For Manufacturing The Same" which claims priority from Korean Patent Application No. 99-0041724, filed Sep. 29, 1999.

BACKGROUND OF THE INVENTION

1. Field of the Invention

The present invention generally relates to a semiconductor device, and more particularly to a redistributed chip size package and a wafer-level method for manufacturing the same.

2. Description of the Related Arts

A goal of the electronic industry is the miniaturization of semiconductor devices. This goal is important in semiconductor packaging. A semiconductor package is a structure including an IC chip sealed in a plastic resin or a ceramic with external terminals that allow connection and use of the chip in an electronic device. Such packages are typically much larger than the chips, and engineers have made great efforts to reduce IC packages to almost the same size as IC chips. An advancement in packaging technology is the Chip Scale Package (also called a Chip Size Package, CSP). A Wafer Level CSP (WL-CSP) is characterized in that multiple packages are collectively assembled and manufactured at the wafer level.

The WL-CSP typically uses flip chip bonding. For the flip chip bonding, a redistribution technique connects aluminum pads on the chip to bigger "rerouted" pads at different positions. External connecting electrodes such as solder balls are on respective rerouted pads. In redistributing the pads and forming the solder balls, a series of processes for manufacturing packages are performed at wafer level.

As known well, a semiconductor wafer commonly includes multiple integrated circuit chips formed on a semiconductor substrate, e.g., a silicon wafer. FIG. 1 schematically shows a wafer 10, and FIG. 2 is an enlarged plan view of a portion "A" of FIG. 1. As shown in FIGS. 1 and 2, each chip 20 has a plurality of chip pads 22 on an upper surface, and scribe lines 14 are between integrated circuit chips 20 on the wafer 10. Passivation layer 24 covers the upper surface of the chip 20 except for the chip pads 22.

FIG. 3 shows a plurality of chip size packages 30 manufactured at the wafer level. External connecting electrodes 36 of FIG. 3, which electrically connect to the chip pads 22 of the chips 20 of FIG. 2, have positions that differ from those of chip pads 22. As described above, the position of each pad for the external connecting electrode 36 is offset from the corresponding chip pad 22 through the rerouting. Sawing the wafer 10 of FIG. 3 along the scribe lines 14 separates individual packages 30.

FIG. 4 show a cross-section of a portion of the conventional wafer level chip size package 30. As shown in FIG. 4, a chip pad 22 and the passivation 24 are on the upper surface of the semiconductor substrate 12. A first polymer layer 31 that absorbs stress and serves a dielectric function is on the passivation 24, and under barrier metal (UBM) layers 32 are on the chip pads 22 and the first polymer layer 31. A redistribution pattern 33 is on the UBM layers 32, and a second polymer layer 34 is on the redistribution pattern 33. The second polymer layer 34 protects the redistribution pattern 33 from external environmental stresses. An external connecting electrode 36 connects to a portion of the redistribution pattern 33 via other UBM layers 35.

Usually, the redistribution pattern 33 is copper (Cu), which has a high electrical conductivity. However, oxygen ($O_2$) in the atmosphere oxidizes or reacts with copper, particularly at high temperature such as used when curing the polymer layer 34. These characteristics of copper reduce the adhesive strength to other materials. Particularly, in the structure of the wafer level chip size package 30 of FIG. 4, oxidation of the copper reduces the adhesive strength between the copper redistribution pattern 33 and the second polymer layer 34, and therefore degrades the reliability of the package.

SUMMARY OF THE INVENTION

According to an aspect of the present invention, the adhesive strength between a copper redistribution layer and a polymer layer is increased to improve the reliability of a WL-CSP package.

In one embodiment of the invention, a semiconductor device includes a semiconductor chip, a first polymer layer, one or more first under barrier metal layers, a copper redistribution pattern, a barrier metal, a second polymer layer, and external connecting electrodes. The semiconductor chip includes a semiconductor substrate, a passivation formed thereon, and a plurality of chip pads exposed through the passivation. The first polymer layer is on the passivation. The first under barrier metal (UBM) layers form a pattern on the chip pads and the first polymer layer. The copper redistribution pattern is on the first UBM layers and electrically connected to the chip pads. The second polymer layer is on the first polymer layer and the copper redistribution pattern,. The barrier metal is on the copper redistribution pattern. The external connecting electrodes are on portions of the copper redistribution pattern or the barrier metal that the second polymer layer exposes.

The barrier metal includes a chrome (Cr), a nickel (Ni), or a nickel-chrome (Ni—Cr) layer, and preferably has a thickness between approximately 0.1 $\mu$m and 50 $\mu$m. The barrier metal may further include a metal inner complex formed by reacting the surface of the Cr, Ni, or Ni—Cr layer with a silane or an azole group solution. Typically, the semiconductor device further includes second under barrier metal (UBM) layers under each of the external connecting electrodes. The first and the second polymer layers are typically selected from the group consisting of polyimide, polybenzoxazole (PBO), benzocyclobutene (BCB), and epoxy.

In another aspect, an embodiment of the present invention provides a method for fabricating semiconductor devices. The method includes (A) providing a semiconductor wafer that includes a semiconductor substrate, a passivation thereon, and a plurality of chip pads exposed through the passivation, (B) forming a first polymer layer on the passivation, (C) forming first under barrier metal (UBM) layers on the chip pads and the first polymer layer, (D) forming a patterned copper redistribution pattern on the first UBM layers, said copper redistribution pattern being electrically connected to the chip pads, (E) forming a barrier metal on the copper redistribution pattern, (F) removing a portion of the first UBM layers that the patterned copper redistribution pattern exposes, (G) forming a second polymer layer on the first polymer layer and the copper redistribution pattern, and (H) forming a plurality of external connecting electrodes on a portion of the copper redistribution pattern exposed through the second polymer layer.

The step (E) can include plating chrome (Cr) or nickel (Ni), or nickel (Ni) and chrome (Cr) in order. After plating, the step (E) can further include reacting the surface of the Cr or Ni layers with a silane or an azole group compound solution to form a metal inner complex. The silane compound is selected from the group consisting of vinyltriacetoxy silane, vinyltrichloro silane, vinyltrimethoxy silane, vinyltriethoxy silane, vinyltris (β-methoxy ethoxy) silane, N-β(amino ethyl)γ-amino propyl methyl dimethoxy silane, N-β(amino ethyl)γ-amino propyl trimethoxy silane, N-β (amino ethyl)γ-amino propyl triethoxy silane, γ-amino propyl trimethoxy silane, γ-amino propyl triethoxy silane, N-phenyl-γ-amino propyl trimethoxy silane, and γ-chloro propyl trimethoxy silane. The azole compound is selected from the group consisting of polybenzimidazole, benzotriazole, 8-azaadenine, and 5-carboxylic benzotriazole. Before and after forming the external connecting electrodes, the method of the present invention can further include forming a second under barrier metal (UBM) layers under each of the external connecting electrodes and dividing the semiconductor wafer into individual packages by sawing.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and in which.

DETAILED DESCRIPTION

Exemplary embodiments of the present invention are described below with reference to the accompanying drawings.

Figure 5:
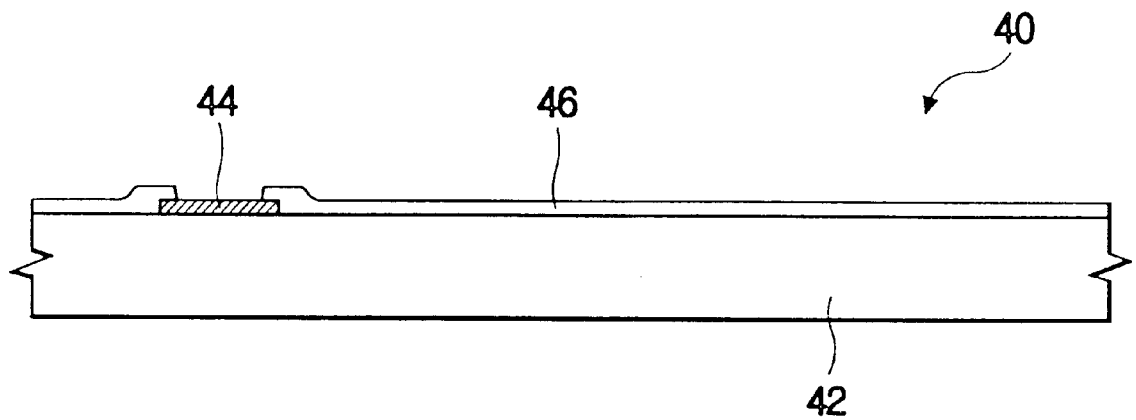
FIGS. 5 through 12 are cross-sectional views of structures created during fabrication of a redistributed WL-CSP using a manufacturing method in accordance with an embodiment of the present invention.

FIGS. 5 through 12 illustrate a manufacturing method for a redistributed WL-CSP in accordance with an embodiment of the present invention. FIG. 5 shows a cross-sectional view of a semiconductor wafer 40 that includes a plurality of chip pads 44 and passivation 46 formed on a semiconductor substrate 42. The semiconductor substrate 42 also includes other integrated circuit elements (not shown), which are fabricated using conventional integrated circuit manufacturing techniques according to the purpose of the IC chip. The chip pad 44 is made of aluminum (Al) or the like, and the passivation 46 contains a nitride layer or the like to protect the IC elements. The passivation 46 covers the whole surface of the semiconductor wafer 40 except for the chip pads 44. The structure of the above-described semiconductor wafer 40 is the same as a conventional wafer for manufacture of WL-CSPs.

Figure 6:
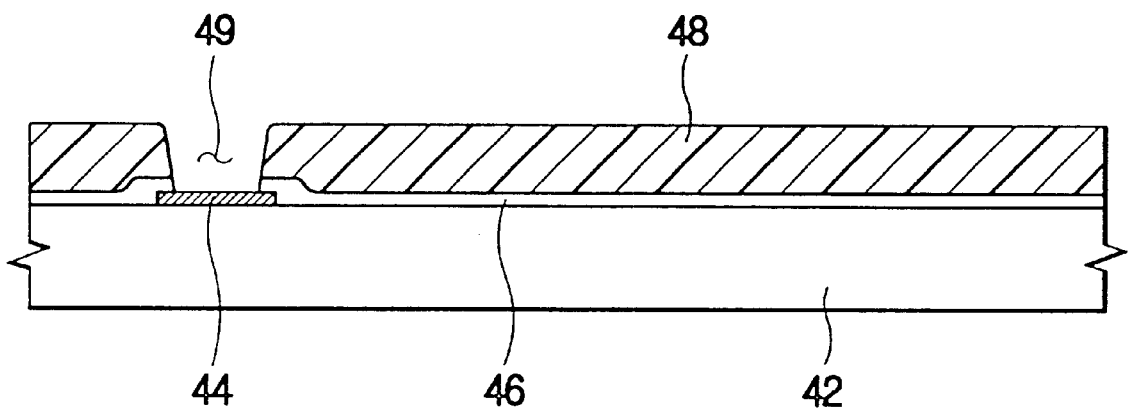

As shown in FIG. 6, a first polymer layer 48 is formed on the passivation 46, but has openings exposing the chip pads 44. The first polymer layer 48 serves as a buffer layer for the thermal stress and as a dielectric layer. The material in the first polymer layer 48 can be polyimide, polybenzoxazole (PBO), benzocyclobutene (BCB), or epoxy. The first polymer layer 48 is formed by coating the wafer with a polymer material and then removing a portion 49 that overlies the chip pads 44. As widely known in the art, a spin-coating method can coat wafer 40 with polymer material, and a photolithography process can create openings exposing the chip pads 44. The first polymer layer 48 has a thickness between about 2 µm and about 50 µm and is cured at approximately 300° C. for about 2 hours.

Figure 7:
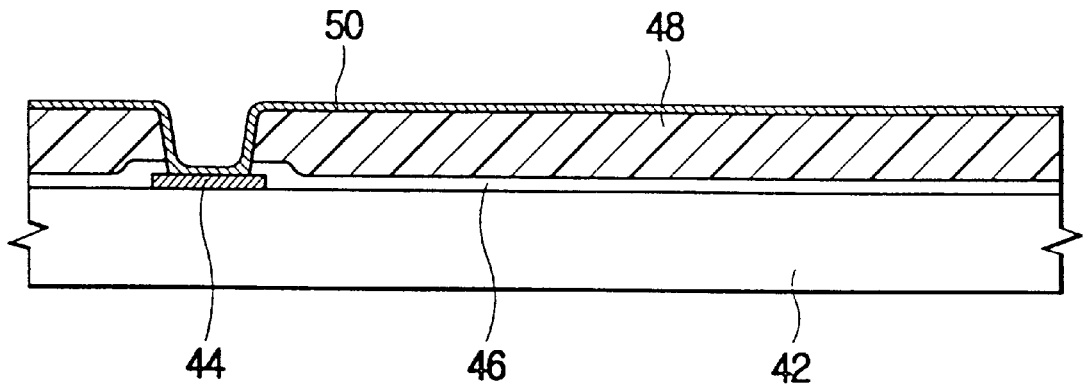

Next is a step of forming first Under Barrier Metal (UBM) layers. As well known in the art, the UBM layers, which can be formed by sputtering, serve as an adhesion promotion layer, a diffusion protection layer, and a plating base layer. FIG. 7 shows the first UBM layers 50 sputtered onto the polymer layer 48. The first UBM layers 50 can be, for example, combinations of titanium (Ti) and copper (Cu), or various combinations of other metals, if necessary.

Figure 8:
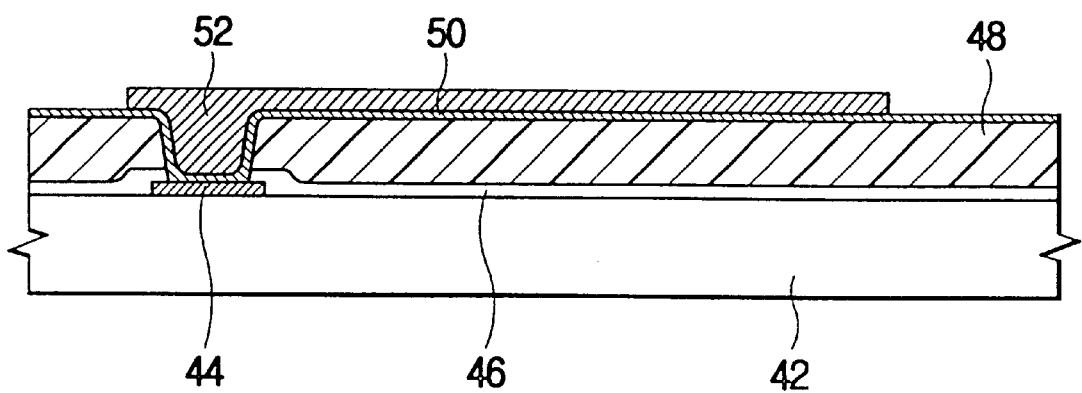

After depositing the first UBM layers 50, a copper redistribution pattern is formed. As described above, the copper redistribution pattern 52 provides wiring patterns for rerouting the chip pads 44, and as shown in FIG. 8, electrically connects to the chip pads 44. To form the redistribution pattern 52, a photoresist is coated the first UBM layers 50 and desirably patterned. Then, copper is plated on exposed portions of the first UBM layers 50. More particularly, the first UBM layers 50 act as a plating electrode, and the plating leaves the copper redistribution pattern 52 with a thickness of approximately 5 µm where the photoresist pattern exposes the copper redistribution.

Figure 9:
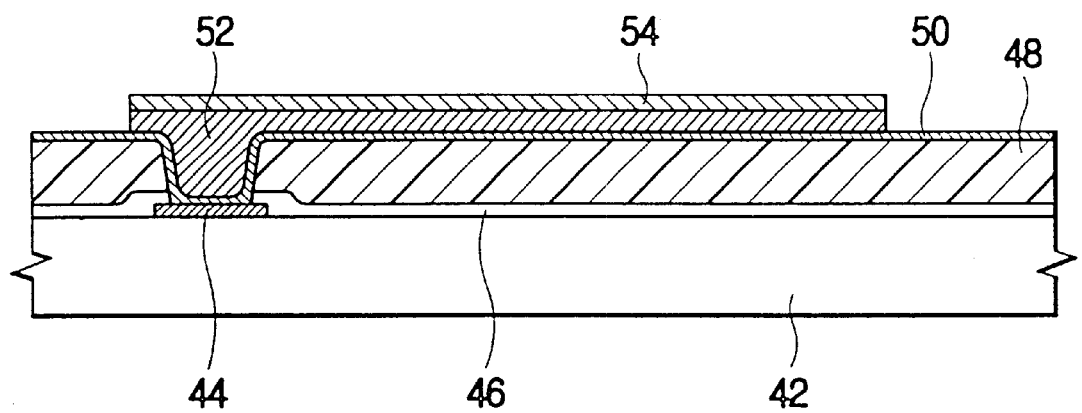

After forming the redistribution pattern 52, a barrier metal is plated on redistribution pattern 52. FIG. 9 shows the barrier metal 54 on the copper redistribution pattern 52. In the embodiment of FIG. 9, the barrier metal 54 is a single layer formed by the plating. The barrier metal 54 is made of a metal that prevents the oxidation of copper and has an excellent adhesive strength to copper and polymer. As the barrier metal 54, chrome (Cr) or nickel (Ni) is preferred.

As the plating method, electroplating is preferable, but electrolessplating may be used depending on the plating materials. When electroplating forms the barrier metal 54, the plating electrode (that is, the first UBM layers 50) and the photoresist pattern used in plating the above-described redistribution pattern 52 on to the first UBM layers 50, can be used in plating the barrier metal 54 on to the redistribution pattern 52. Accordingly, the plating of the barrier metal 54 solely onto the redistribution pattern 52 does not require any additional apparatus or process. The plating process has a high speed for forming the barrier metal 54 and excellent electric characteristics due to layer uniformity.

Figure 13:
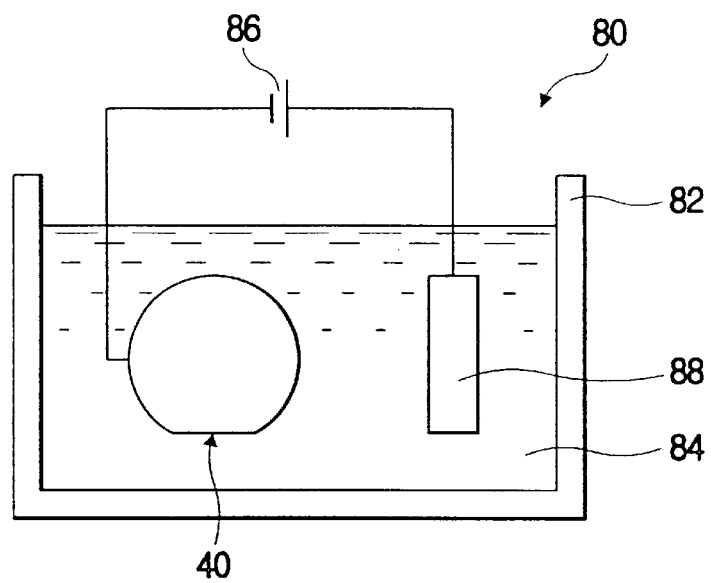
FIG. 13 is a schematic view of an electroplating apparatus used in the manufacturing method according to an embodiment of the present invention.

With reference to FIG. 13, the surface of the wafer 40 is electroplated in a plating apparatus 80. A plating bath 82 contains various electrolytes 84 selected according to the desired plating material. The wafer 40 and a plating electrode 88 respectively connected to the poles of the power supply 86 are dipped into the plating bath 82. The first UBM layers 50 (FIG. 9) on the wafer 40 acts as the other plating electrode. The barrier metal 54 (FIG. 9) is therefore plated on the copper redistribution pattern 52 (FIG. 9) exposed through the photoresist pattern. The plating forms the barrier metal 54 to a thickness between about 0.1 $\mu$m and about 50 $\mu$m.

Figure 10:
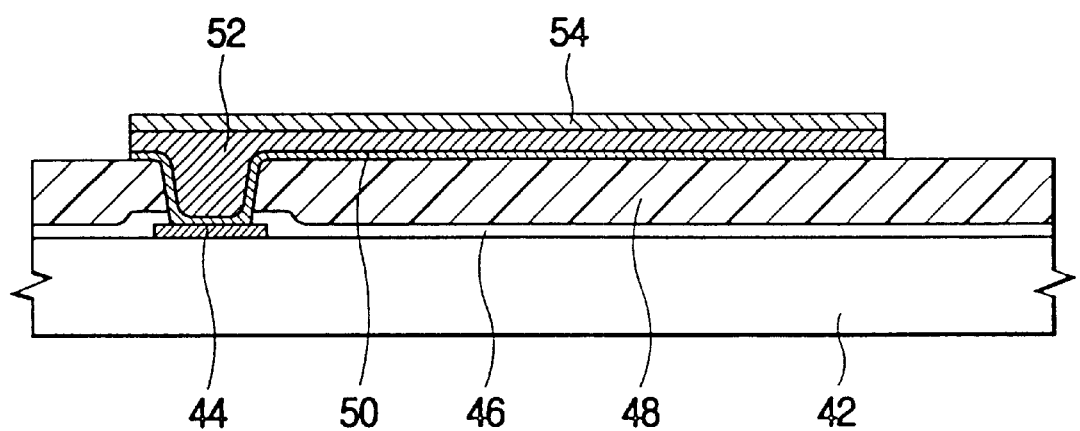

After the plating process, the photoresist pattern is removed, and the first UBM layers 50 are then etched using the redistribution pattern 52 as a mask. Then, as shown in FIG. 10, the UBM layers 50 remain only under the redistribution pattern 52.

Figure 11:
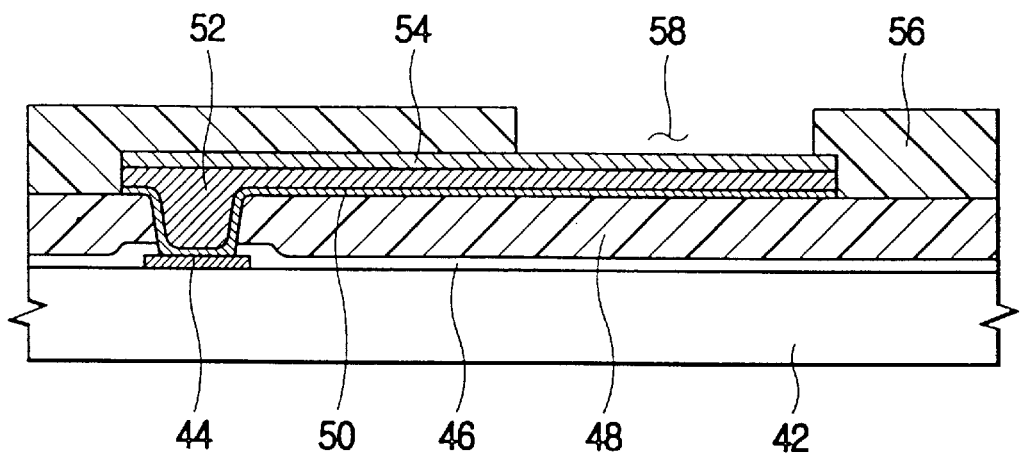

FIG. 11 illustrates formation of a second polymer layer 56. The second polymer layer 56 protects the copper redistribution pattern 52 from the external environment, and the material and forming method of the second polymer layer 56 are the same as those of the first polymer layer 48. After coating a polyimide material for the second polymer layer 56, conventional photolithography and development processes partially remove the second polymer layer 56 to expose pads 58 for receiving external connecting electrodes.

Figure 1:
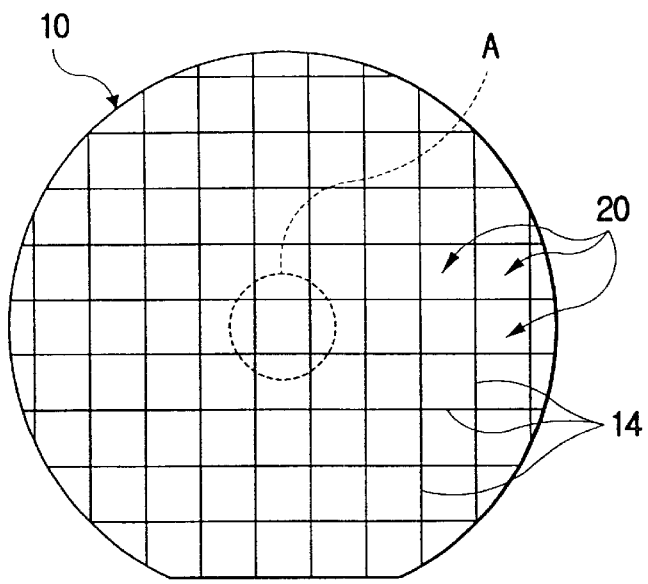
FIG. 1 is a schematic plan view showing a conventional wafer for fabrication of wafer level chip scale packages (WL-CSP)
Figure 2:
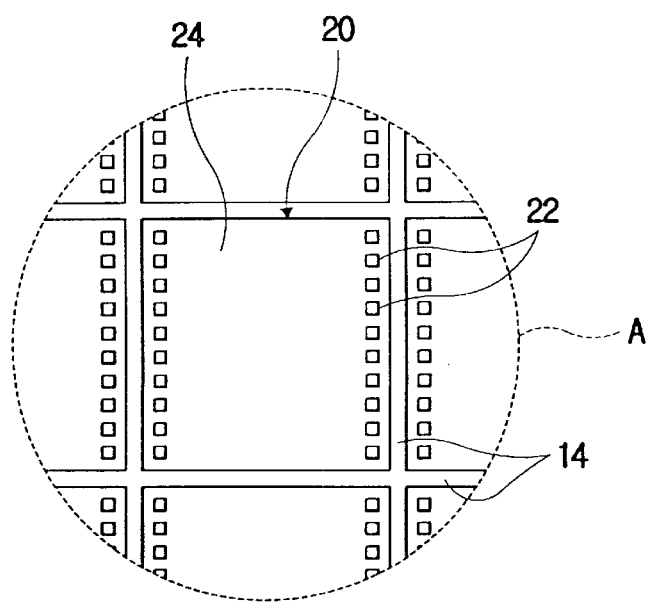
FIG. 2 is an enlarged plan view of a portion "A" of FIG. 1.
Figure 3:
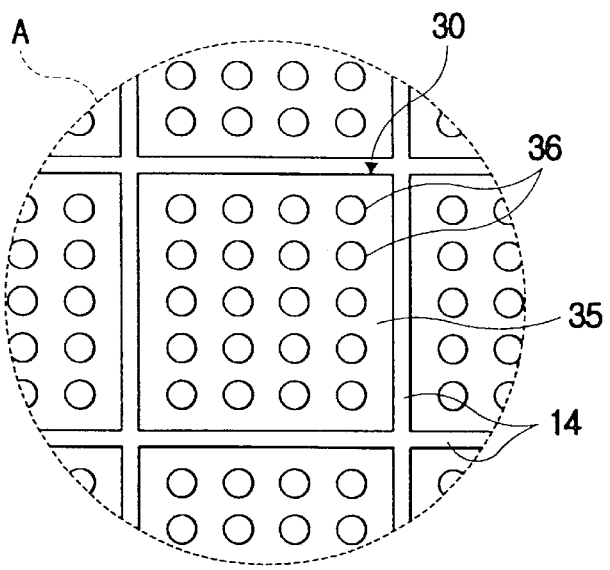
FIG. 3 is a plan view showing conventional WL-CSPs.
Figure 4:
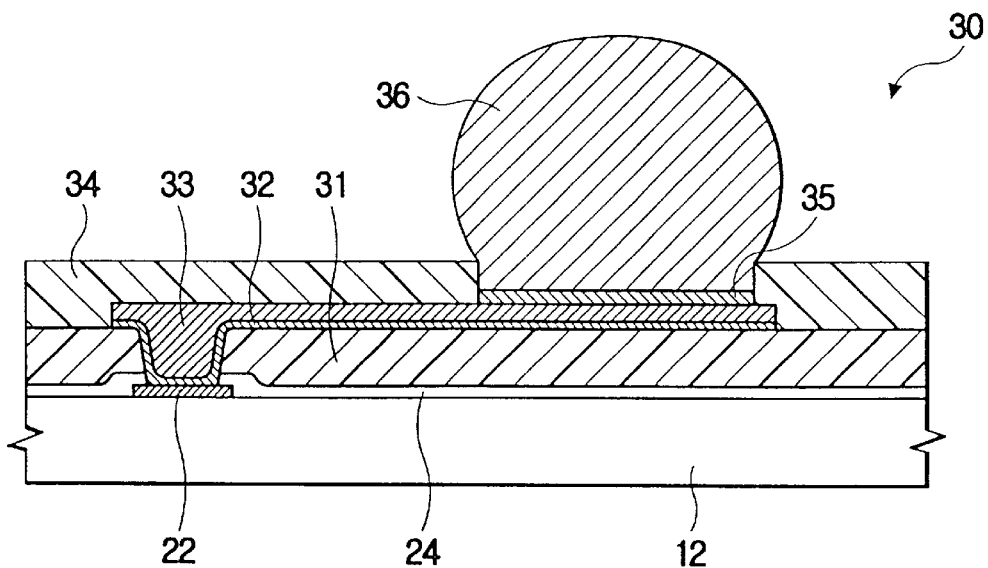
FIG. 4 is a cross-sectional view of a portion of a package in FIG. 3.
Figure 12:
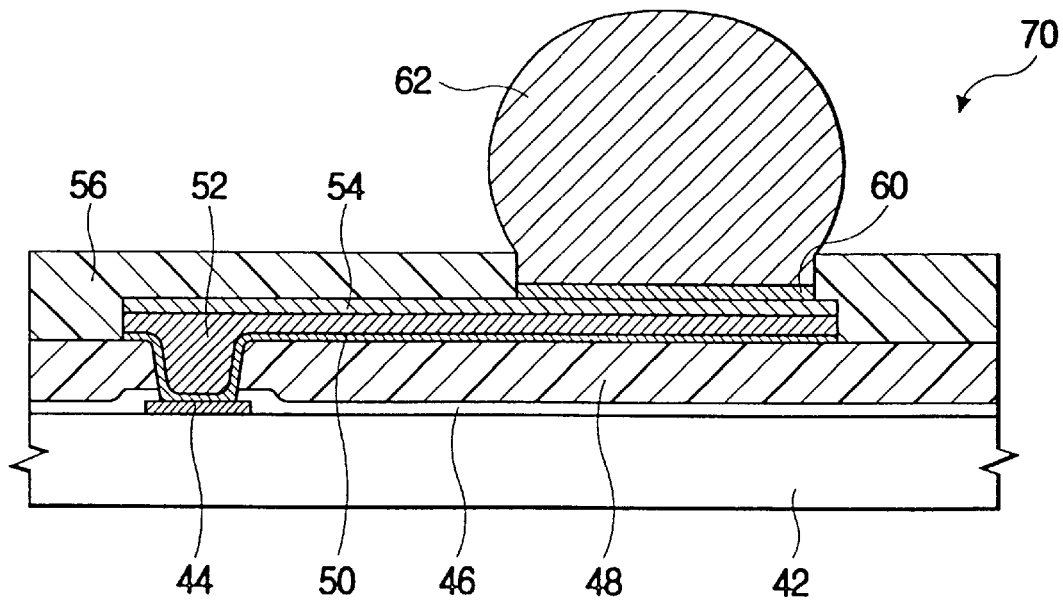

Prior to forming the external connecting electrodes, second UBM layers 60 are formed on the pad 58. As shown in FIG. 12, an external connecting electrode 62 such as a solder ball is formed on the second UBM layers 60, and then the wafer-level manufacture of chip size packages 70 are complete. Sawing the wafer along the scribe lines 14 (FIG. 3) separates the individual packages 70.

The second UBM layers 60 under the external connecting electrode 62 can contain various combinations of nickel (Ni), gold (Au), titanium (Ti), copper (Cu), palladium (Pd), chrome (Cr), aluminum (Al), or the like. The barrier metal 54 of the present invention performs some of the functions of the UBM layers 60. Accordingly, the present invention has an advantage in that the number of layers in the second UBM layers 60 can be reduced.

As the external connecting electrode 62, the solder ball is preferably used, but a bump made of metal such as copper (Cu), gold (Au), or nickel (Ni) may be used. A plating method typically forms the metal bump. However, various methods can form solder balls. For example, besides plating, ball placement, stencil printing, or the like can form the solder balls, and a reflow process completes final formation of the ball shape of the solder ball. The solder ball typically has a diameter of approximately 400 $\mu$m.

Figure 14:
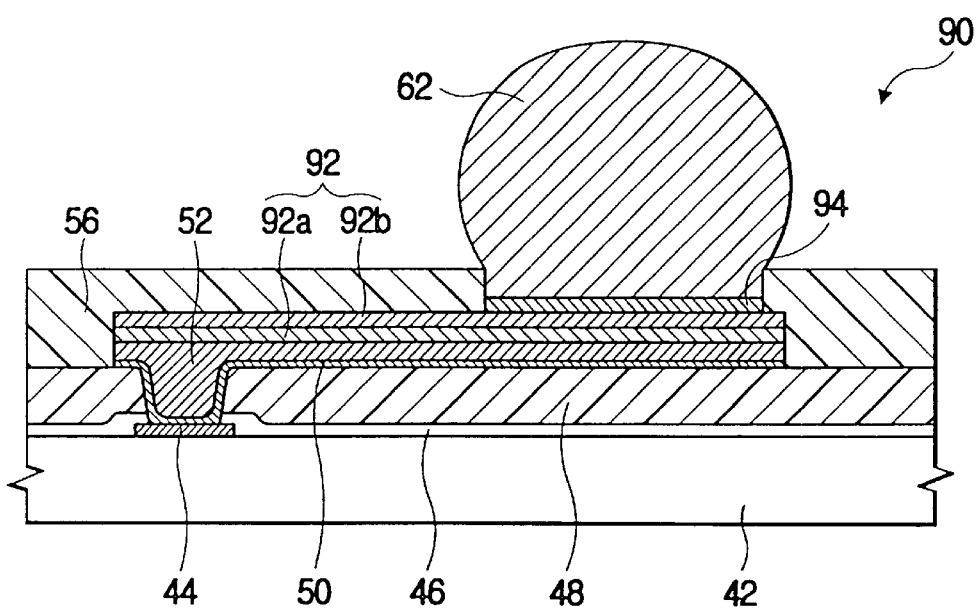
FIG. 14 is a cross-sectional view showing a redistributed WL-CSP in accordance with an embodiment of the present invention.

The barrier metal in embodiments of the present invention may include multiple layers. FIG. 14 shows a package 90 with the barrier metal including two layers. As in the above-described embodiment of the present invention, nickel (Ni) and chrome (Cr) form the barrier metal 92. For example, a Ni layer 92a and a Cr layer 92b are successively plated on the redistribution pattern consequently forming the barrier metal 92. Electroplating is generally used, but electrolessplating with a metal such as Ni can be used. Since this embodiment of the present invention provides the barrier metal 92 with two different metal layers 92a and 92b, a single layer, for instance, only a gold (Au) layer is sufficient for the second UBM layers 94 under the external connecting electrodes 62.

Figure 15:
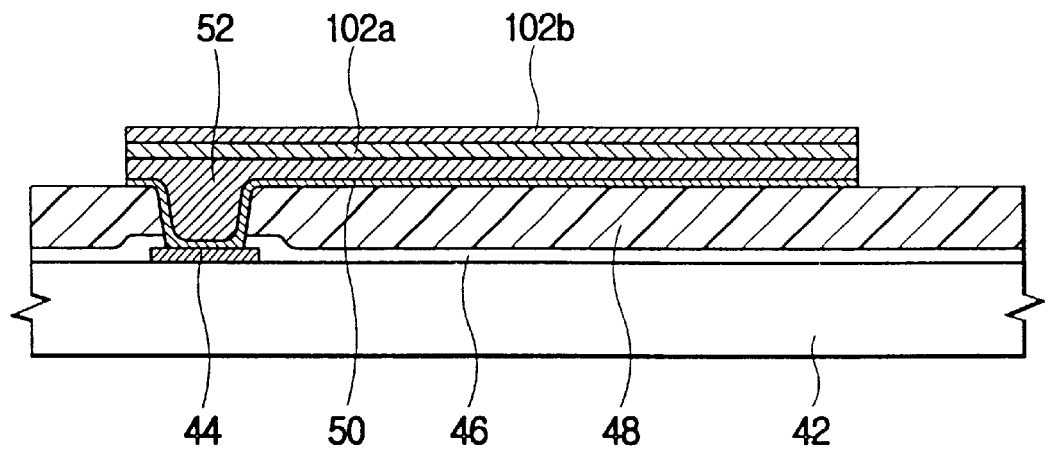
FIGS. 15 through 17 are cross-sectional views of structures created during fabrication of a redistributed WL-CSP using a manufacturing method in accordance with another embodiment of the present invention.
Figure 16:
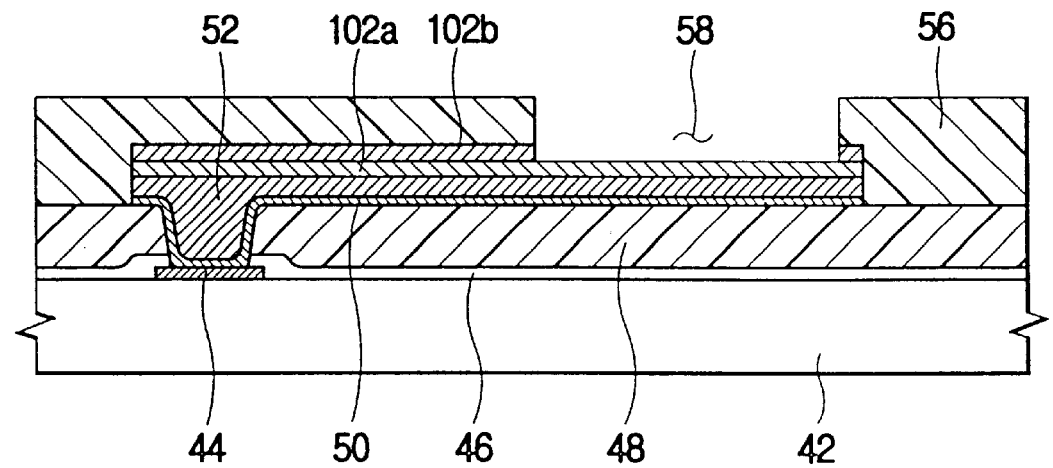
Figure 17:
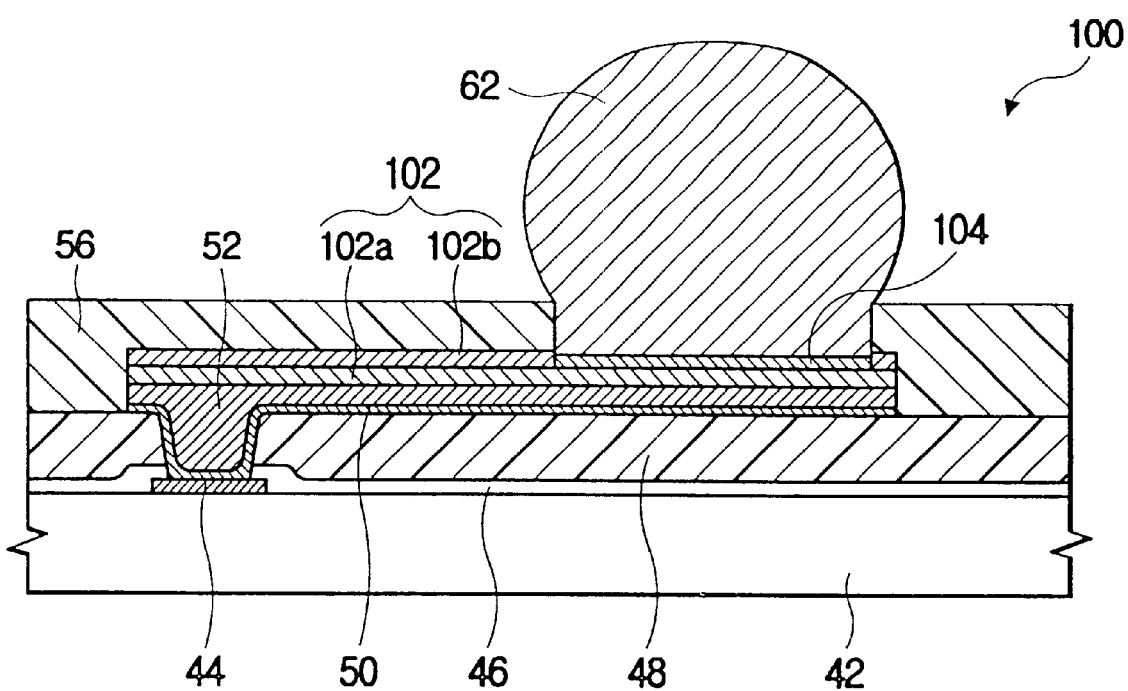

FIGS. 15 through 17 illustrate another method for forming a redistributed WL-CSP in accordance with the invention. In this embodiment, the barrier metal formation includes plating and chemical treatment.

With reference to FIG. 15, plating forms a metal layer 102a on the copper redistribution pattern 52, and surface treatment with a chemical solution forms an upper layer 102b on the metal layer 102a. The upper layer 102b is called a metal inner complex. When the plating layer 102a is dipped into the chemical solution, the surface of the plating layer 102a reacts with the chemical solution to physically and chemically change the surface of the metal and improve anticorrosion properties.

The chemical solution used in this embodiment contains a compound from a silane group or an azole group. The silane group includes vinyltriacetoxy silane, vinyltrichloro silane, vinyltrimethoxy silane, vinyltris ($\beta$-methoxy ethoxy) silane, N-$\beta$(Amino ethyl)$\gamma$-amino propyl methyl dimethoxy silane, N-$\beta$(amino ethyl)$\gamma$-amino propyl trimethoxy silane, N-$\beta$(amino ethyl)$\gamma$-amino propyl triethoxy silane, $\gamma$-amino propyl trimethoxy silane, $\gamma$-amino propyl triethoxy silane, N-phenyl-$\gamma$-Amino propyl trimethoxy silane, and $\gamma$-chloro propyl trimethoxy silane. Particularly, vinyltriacetoxy silane or N-$\beta$(amino ethyl)$\gamma$-amino propyl triethoxy silane is preferred. The azole group includes polybenzimidazole, benzimidazole, benzotriazole, 8-azaadenine, and 5-carboxylic benzotriazole. Polybenzimidazole is preferred. For the silane group compounds, the solvent for the solution is typically methoxypropanol or isopropanol with a solute concentration between about 0.1 and 20% by weight. For the azole group compounds, the solvent is typically water or dimethylformamide (DMF) with a solute concentration of between about 0.001 and 1.0% by weight. The solvent is selected according to the compound or solute used. For example, DMF is the solvent for benzimidazole from the azole group.

The metal inner complex 102b forms when the plating layer 102a is dipped into the chemical solution at the room temperature for 2 to 3 minutes. In case of several materials such as polybenzimidazole, a higher temperature of approximately 80° C. is preferable. After the chemical treatment of the surface of the plating layer, a second polymer layer 56 is formed as shown in FIG. 16. As described above, a photolithography process partially removes the second polymer layer 56 to expose a pad 58 for an external connecting electrode 62. Herein, portions of the metal inner complex 102b are removed with the portions of the second polymer layer 56, and as shown in FIG. 17, the second UBM layers 104 are formed before and under the external connecting electrode 62.

The package 100 of FIG. 17 further includes the metal inner complex 102b. The chemical surface treatment forms the metal inner complex 102b by reacting the surface of the metal layer 102a with the chemical solution to prevent corrosion and improve the adhesive strength between the copper redistribution pattern 52 and the second polymer layer 56.

As described above, the WL-CSP of the present invention comprises the barrier metal between a copper redistribution pattern and an overlying polymer layer. Therefore, the oxidation of the copper redistribution pattern at high temperatures, such as during the curing process of the polymer layer, is prevented. Further, the adhesive strength between the copper redistribution pattern and the polymer layer is increased to improve the reliability of the package.

Since the barrier metal is formed by the above-described plating method, the present invention does not require an additional apparatus or process and thereby cuts production costs. Since the barrier metal can replace conventional UBM layers, use of the barrier metal can omit or reduce the number of steps for forming the UBM layers. Further, the plating process has a high speed for forming the barrier metal and uniformly forms the barrier metal layer to provide excellent electric characteristics.

Although embodiments of the present invention have been described above, many variations and/or modifications of the disclosed embodiments fall within the spirit and scope of the present invention as defined in the appended claims.

What is claimed is:

1. A method for fabricating semiconductor devices, said method comprising:
   (A) providing a semiconductor wafer, said wafer including a semiconductor substrate, a passivation formed thereon, and a plurality of chip pads exposed through openings in the passivation;
   (B) forming a first polymer layer on the passivation;
   (C) forming first under barrier metal (UBM) layers on the chip pads and the first polymer layer;
   (D) forming a copper redistribution pattern on the first UBM layers, said copper redistribution pattern being electrically connected to the chip pads;
   (E) forming a barrier metal on the copper redistribution pattern;
   (F) removing a portion of the first UBM layers, said portion of the first UBM layers being exposed by the copper redistribution pattern;
   (G) forming a second polymer layer on the first polymer layer and the copper redistribution pattern; and
   (H) forming a plurality of external connecting electrodes on a portion of the copper redistribution pattern, said portion of the copper redistribution pattern being exposed by the second polymer layer.

2. The method of claim 1, wherein the step (E) of forming the barrier metal comprises plating chrome (Cr) on the copper redistribution pattern.

3. The method of claim 2, wherein the step (E) further comprises forming a metal inner complex by reacting the surface of the chrome with a silane or an azole group compound solution.

4. The method of claim 3, wherein the silane group compound is selected from the group consisting of vinyltri-acetoxy silane, vinyltrichloro silane, vinyltrimethoxy silane, vinyltriethoxy silane, vinyltris (β-methoxy ethoxy) silane, N-β(amino ethyl)γ-amino propyl methyl dimethoxy silane, N-β(amino ethyl)γ-amino propyl trimethoxy silane, N-β (amino ethyl)γ-amino propyl triethoxy silane, γ-amino propyl trimethoxy silane, γ-amino propyl triethoxy silane, N-phenyl-γ-amino propyl trimethoxy silane, and γ-chloro propyl trimethoxy silane.

5. The method of claim 3, wherein the azole compound is selected from the group consisting of polybenzimidazole, benzotriazole, 8-azaadenine, and 5-carboxylic benzotriazole.

6. The method of claim 1, wherein the step (E) of forming the barrier metal comprises plating nickel (Ni) on the copper redistribution pattern.

7. The method of claim 6, wherein the step (E) further comprises forming a metal inner complex by reacting the surface of the nickel with a silane or an azole group chemical compound solution.

8. The method of claim 7, wherein the silane group compound is selected from the group consisting of vinyltri-acetoxy silane, vinyltrichloro silane, vinyltrimethoxy silane, vinyltriethoxy silane, vinyltris (β-methoxy ethoxy) silane, N-β(Amino ethyl)γ-amino propyl methyl dimethoxy silane, N-β(amino ethyl)γ-amino propyl trimethoxy silane, N-β (Amino ethyl)γ-amino propyl triethoxy silane, γ-amino propyl trimethoxy silane, γ-amino propyl triethoxy silane, N-phenyl-γ-amino propyl trimethoxy silane, and γ-chloro propyl trimethoxy silane.

9. The method of claim 7, wherein the azole compound is selected from the group consisting of polybenzimidazole, benzotriazole, 8-azaadenine, and 5-carboxylic benzotriazole.

10. The method of claim 1, wherein forming the barrier metal comprises plating nickel (Ni) and chrome (Cr) in order on the copper redistribution pattern.

11. The method of claim 1, further comprising forming second under barrier metal (UBM) layers under each of the external connecting electrodes before forming the external connecting electrodes.

12. The method of claim 1, further comprising dividing the semiconductor wafer into individual packages by sawing after forming the external connecting electrodes.

13. The method of claim 1, further comprising forming a photoresist pattern on the first UBM layers, wherein:
   the step (D) of forming the copper redistribution pattern comprises plating the first UBM layers, wherein the photoresist pattern defines boundaries of the copper redistribution pattern; and
   the step (E) of forming a barrier metal comprises plating the copper redistribution pattern, wherein the photoresist pattern limits plating to the copper redistribution pattern.

* * * * *